(12) United States Patent
Cai et al.

(10) Patent No.: US 9,048,280 B2
(45) Date of Patent: Jun. 2, 2015

(54) VERTICAL POLYSILICON-GERMANIUM HETEROJUNCTION BIPOLAR TRANSISTOR

(71) Applicant: International Business Machines Corporation, Armonk, NY (US)

(72) Inventors: Jin Cai, Cortlandt Manor, NY (US); Kevin K. Chan, Staten Island, NY (US); Wilfried E. Haensch, Somers, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/923,906

(22) Filed: Jun. 21, 2013

(65) Prior Publication Data

US 2013/0288447 A1    Oct. 31, 2013

Related U.S. Application Data

(62) Division of application No. 13/048,366, filed on Mar. 15, 2011, now Pat. No. 8,492,794.

(51) Int. Cl.
*H01L 21/8224* (2006.01)
*H01L 29/737* (2006.01)
*H01L 29/66* (2006.01)
(Continued)

(52) U.S. Cl.
CPC ............ *H01L 29/737* (2013.01); *H01L 29/0649* (2013.01); *H01L 29/0821* (2013.01); *H01L 29/165* (2013.01); *H01L 29/66242* (2013.01);
(Continued)

(58) Field of Classification Search
CPC .............. H01L 29/735; H01L 27/0652; H01L 27/0658; H01L 27/075; H01L 27/0755; H01L 27/0823
USPC ......... 438/189, 234, 235, 309, 311, 312, 336, 438/341, 350; 257/183, 197, 198, 565, 257/E29.171, E29.174, E21.35
See application file for complete search history.

(56) References Cited

U.S. PATENT DOCUMENTS 4,119,994 A    10/1978  Jain et al.
4,716,445 A    12/1987  Sone
(Continued)

OTHER PUBLICATIONS

Nii, H. et al., "A Novel Lateral Bipolar Transistor with 67 GHz fmax on Thin-Film SOI for RF Analog Applications" IEEE Transactions on Electron Devices (Jul. 2000) pp. 1536-1541, vol. 47, No. 7.
(Continued)

*Primary Examiner* — Galina Yushina
(74) *Attorney, Agent, or Firm* — Scully, Scott, Murphy & Presser, P.C.; Louis J. Percello, Esq.

(57) ABSTRACT

A vertical heterojunction bipolar transistor (HBT) includes doped polysilicon having a doping of a first conductivity type as a wide-gap-emitter with an energy bandgap of about 1.12 eV and doped single crystalline Ge having a doping of the second conductivity type as the base having the energy bandgap of about 0.66 eV. Doped single crystalline Ge having of doping of the first conductivity type is employed as the collector. Because the base and the collector include the same semiconductor material, i.e., Ge, having the same lattice constant, there is no lattice mismatch issue between the collector and the base. Further, because the emitter is polycrystalline and the base is single crystalline, there is no lattice mismatch issue between the base and the emitter.

18 Claims, 11 Drawing Sheets

(51) Int. Cl.
  *H01L 21/762* (2006.01)
  *H01L 21/8249* (2006.01)
  *H01L 29/06* (2006.01)
  *H01L 29/08* (2006.01)
  *H01L 29/165* (2006.01)

(52) U.S. Cl.
  CPC ...... *H01L 29/7375* (2013.01); *H01L 21/76229* (2013.01)

(56) References Cited

U.S. PATENT DOCUMENTS

| | | | |
|---|---|---|---|
| 5,962,880 A | 10/1999 | Oda et al. | |
| 6,316,321 B1 | 11/2001 | Lin et al. | |
| 6,399,993 B1 | 6/2002 | Ohnishi et al. | |
| 6,573,188 B1 | 6/2003 | Lai et al. | |
| 6,897,545 B2 | 5/2005 | Menut et al. | |
| 6,939,772 B2 * | 9/2005 | Asai et al. | 438/350 |
| 6,949,764 B2 | 9/2005 | Ning | |
| 6,974,977 B2 | 12/2005 | Washio et al. | |
| 7,119,416 B1 | 10/2006 | Adam et al. | |
| 7,294,869 B2 * | 11/2007 | Pagette | 257/198 |
| 7,538,373 B2 | 5/2009 | Ellis-Monaghan et al. | |
| 7,598,539 B2 | 10/2009 | Wilhelm | |
| 7,888,745 B2 | 2/2011 | Khater et al. | |
| 2003/0122154 A1 | 7/2003 | Babcock et al. | |
| 2005/0110044 A1 | 5/2005 | Fan et al. | |
| 2005/0250289 A1 * | 11/2005 | Babcock et al. | 438/309 |
| 2007/0045664 A1 * | 3/2007 | Miura et al. | 257/197 |
| 2007/0298578 A1 * | 12/2007 | Khater et al. | 438/322 |
| 2008/0217742 A1 | 9/2008 | Johnson et al. | |
| 2008/0261371 A1 | 10/2008 | Ho et al. | |
| 2010/0003800 A1 * | 1/2010 | Pagette et al. | 438/311 |
| 2011/0042553 A1 * | 2/2011 | Masini et al. | 250/214 A |
| 2012/0032303 A1 | 2/2012 | Elkareh et al. | |
| 2012/0139009 A1 | 6/2012 | Ning et al. | |

OTHER PUBLICATIONS

Harame, D. L. et al., "Si/SiGe Epitaxial-Base Transistors—Part I: Materials, Physics, and Circuits" IEEE Transactions on Electron Devices (Mar. 1995) pp. 455-468, vol. 42(3).

Diexler, P. et al., "Explorations for High Performance SiGe-Heterojunction Bipolar Transistor Integration" Proceedings of BCTM (Sep. 30-Oct. 2, 2001) pp. 30-33.

U.S. Office Action dated Jul. 26, 2012 issued in related U.S. Appl. No. 13/048,342.

U.S. Office Action dated Jul. 27, 2013 issued in related U.S. Appl. No. 13/048,366.

* cited by examiner

VERTICAL POLYSILICON-GERMANIUM HETEROJUNCTION BIPOLAR TRANSISTOR

CROSS REFERENCE TO RELATED APPLICATION

This application is a divisional of U.S. patent application Ser. No. 13/048,366, filed Mar. 15, 2011, which is related to U.S. Patent Application Publication No. US 2012/0235151 published on Sep. 20, 2012, the entire contents and disclosures of which are incorporated herein by reference.

BACKGROUND

The present disclosure relates to semiconductor devices, and particularly to vertical polysilicon-germanium heterojunction bipolar transistors and methods of manufacturing the same.

The collector current of a bipolar transistor is a function of the energy bandgap of the base region material. For a regular silicon base bipolar transistor, it takes an emitter-base bias of about 0.92 V to obtain a collector current density of 10 mA/$\mu m^2$. It is desirable to be able to reduce the voltage needed to drive a bipolar transistor.

The state of art SiGe-base bipolar transistors have silicon in the collector, a SiGe alloy in the base, and polysilicon as emitter. The distribution of Ge across the SiGe base region can be relatively uniform, or can be graded with higher Ge concentration near the collector end and lower, or zero, Ge concentration at the emitter end.

An example of the graded Ge distribution across the base region with zero Ge concentration at the emitter end can be found in the paper by D. L. Harame et al., "Si/SiGe epitaxial-base transistors—Part I: materials, physics, and circuits," IEEE Transactions on Electron Devices, vol. 42, p. 455, 1995. The SiGe base region is single crystalline, and is grown epitaxially on top of a single crystalline silicon collector layer. With zero or relatively low Ge concentration at the emitter end, there is little energy bandgap difference between the emitter and the base at the emitter-base junction. Thus, this transistor is not a wide-gap-emitter heterojunction bipolar transistor.

An example of a SiGe-base bipolar transistor having relatively uniform Ge distribution across the base region can be found in the paper by P. Deixler et al., "Explorations for high performance SiGe-heterojunction bipolar transistor integration," Proceedings of BCTM, p. 30, 2001. The SiGe base region is single crystalline, and is grown epitaxially on top of a single crystalline silicon collector layer. With the Ge distribution that is relatively uniform across the base, the energy bandgap of the base region is smaller than the energy bandgap of the emitter at the emitter-base junction. While this is a wide-gap-emitter heterojunction bipolar transistor, the Ge concentration in this prior art is only 15%, resulting in an energy bandgap of about 1.0 eV. Further increase in the Ge concentration in the SiGe alloy in the base region is not possible because Ge concentration greater than 15% in a SiGe alloy destroys epitaxial alignment between the base and the collector due to excessive lattice mismatch between the underlying silicon material and the SiGe alloy. In other words, to avoid defects being generated in the SiGe-base region, the Ge concentration has to stay below some limit, i.e., at about 15% Ge or less.

SUMMARY

In the present disclosure, a vertical heterojunction bipolar transistor (HBT) includes doped polysilicon having a doping of a first conductivity type as a wide-gap-emitter with an energy bandgap of about 1.12 eV and doped single crystalline Ge having a doping of the second conductivity type as the base having an energy bandgap of about 0.66 eV. Doped single crystalline Ge having a doping of the first conductivity type is employed as the collector. Because the base and the collector include the same semiconductor material, i.e., Ge, having the same lattice constant, there is no lattice mismatch issue between the collector and the base. Further, because the emitter is polycrystalline and the base is single crystalline, there is no lattice mismatch issue between the base and the emitter. The small band gap of the base enables reduction of the emitter-base bias by a factor of about 2 compared to a regular silicon-base bipolar transistor.

The vertical heterojunction bipolar transistor structure can be built using a bulk Ge substrate or a germanium-on-insulator (GOI) substrate. An npn vertical HBT or a pnp vertical HBT can be formed depending on the selection of the first conductivity type and the second conductivity type.

According to an aspect of the present disclosure, a heterojunction bipolar transistor (HBT) structure is provided, which includes: a collector including a first single crystalline germanium portion having a doping of a first conductivity type; a base including a second single crystalline germanium portion epitaxially aligned to the collector and having a doping of a second conductivity type that is the opposite of the first conductivity type; and an emitter including a polycrystalline silicon portion having a doping of the first conductivity type.

According to another aspect of the present disclosure, a method of fabricating a heterojunction bipolar transistor (HBT) structure is provided, which includes: forming a collector and a base in a substrate, wherein the collector includes a first single crystalline germanium portion having a doping of a first conductivity type and the base includes a second single crystalline germanium portion epitaxially aligned to the collector and has a doping of a second conductivity type that is the opposite of the first conductivity type; and forming an emitter including a polycrystalline silicon portion having a doping of the first conductivity type directly on the base.

DETAILED DESCRIPTION

As discussed above, the present disclosure relates to vertical polysilicon-germanium heterojunction bipolar transistors and methods of manufacturing the same, which are now described in more detail by referring to the accompanying drawings. Like and corresponding elements are referred to by like reference numerals in the drawings. The drawings are not necessarily drawn to scale.

Figure 1:
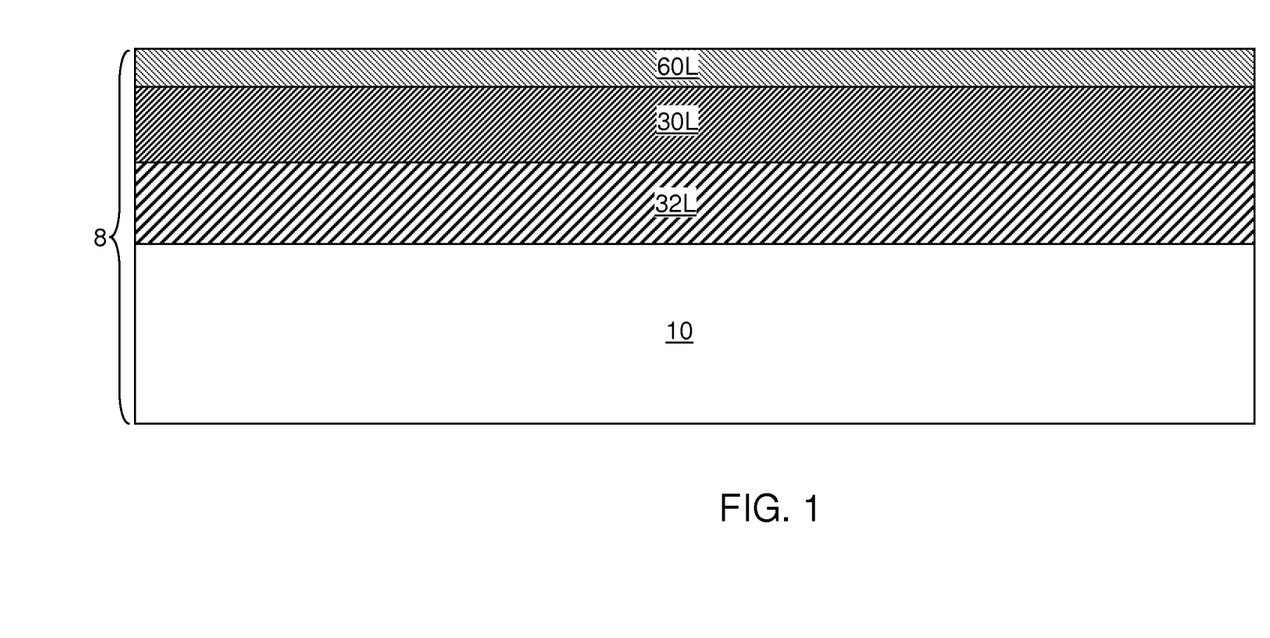
FIG. 1 is a vertical cross-sectional view of a first exemplary structure according to a first embodiment of the present disclosure after formation of a subcollector layer, a collector layer, and a base layer.

Referring to FIG. 1, a first exemplary structure according to a first embodiment of the present disclosure includes a substrate 8, which includes a vertical stack, from bottom to top, of a substrate layer 10, a subcollector layer 32L, a collector layer 30L, and a base layer 60L. The entirety of the substrate 8 can be a single crystalline substrate with epitaxial alignment throughout the entirety thereof. The substrate 8 of FIG. 1 can be provided, for example, by providing a single crystalline germanium substrate and implanting dopants of various conductivity types into an upper portion of the single crystalline germanium substrate. For example, dopants of a first conductivity type, which can be p-type or n-type, can be implanted into the single crystalline germanium substrate to form the subcollector layer 32L and the collector layer 30L. Typically, the single crystalline germanium substrate is intrinsic or has a doping of the opposite conductivity type to the first conductivity type, which is herein referred to as a second conductivity type. If the first conductivity type is p-type, the second conductivity type is n-type, and vice versa.

Thus, the substrate layer 10 is either intrinsic or has a doping of the second conductivity type at a dopant concentration, which can be from $1.0 \times 10^{14}/cm^3$ to $1.0 \times 10^{19}/cm^3$, and typically from $1.0 \times 10^{15}/cm^3$ to $1.0 \times 10^{16}/cm^3$, although lesser and greater dopant concentrations can also be employed. The subcollector layer 32L has a doping of the first conductivity type at a dopant concentration from $1.0 \times 10^{18}/cm^3$ to $1.0 \times 10^{21}/cm^3$, and typically from $1.0 \times 10^{19}/cm^3$ to $5.0 \times 10^{20}/cm^3$, although lesser and greater dopant concentrations can also be employed. The subcollector layer 32L can have a uniform thickness throughout, which can be typically from 100 nm to 1,000 nm, although lesser and greater thicknesses can also be employed. The subcollector layer 32L provides a lateral conductive path. The collector layer 30L has a doping of the first conductivity type at a dopant concentration from $1.0 \times 10^{15}/cm^3$ to $5.0 \times 10^{19}/cm^3$, and typically from $1.0 \times 10^{16}/cm^3$ to $1.0 \times 10^{19}/cm^3$, although lesser and greater dopant concentrations can also be employed. The collector layer 30L can have a uniform thickness throughout, which can be typically from 100 nm to 500 nm, although lesser and greater thicknesses can also be employed.

The base layer 60L has a doping of the second conductivity type at a dopant concentration from $1.0 \times 10^{16}/cm^3$ to $2.0 \times 10^{20}/cm^3$, and typically from $1.0 \times 10^{17}/cm^3$ to $1.0 \times 10^{20}/cm^3$, although lesser and greater dopant concentrations can also be employed. The base layer 60L can have a uniform thickness throughout, which can be typically from 30 nm to 300 nm, although lesser and greater thicknesses can also be employed.

While FIG. 1 illustrates an embodiment in which the subcollector layer 32L, the collector layer 30L, and the base layer 60L laterally extend throughout the entirety of the substrate 8, embodiments in which an implantation mask layer (not shown) is employed to form the subcollector layer 32L, the collector layer 30L, and the base layer 60L only within an area of the substrate 8 that is less than the entire area of the substrate 8 can also be employed.

Alternately, one or more of the subcollector layer 32L, the collector layer 30L, and the base layer 60L can be formed by epitaxial deposition of germanium, for example, by chemical vapor deposition employing a precursor such as $GeH_4$, $Ge_2H_6$, $GeHCl_3$, $GeH_2Cl_2$, and/or any other precursor for depositing germanium as known in the art.

The substrate 8 thus includes a vertical stack, from top to bottom, of a base layer 60L, the collector layer 30L, and the subcollector layer 32L. The collector layer 30L is a first single crystalline germanium layer having a doping of the first conductivity type. The base layer 60L is a second single crystalline germanium layer epitaxially aligned to the collector layer 30L and has a doping of the second conductivity type. The subcollector layer 32L is a third single crystalline germanium layer, has a doping of the first conductivity type, underlies the collector layer 30L, and is epitaxially aligned to the collector layer 30L. Typically, the dopant concentration of the subcollector layer 32L is greater than the dopant concentration of the collector layer 30L.

Each of the subcollector layer 32L and the collector layer 30L consists essentially of germanium and dopants of the first conductivity type. The base layer 60L consists essentially of germanium and dopants of the second conductivity type. P-type dopants include B, Ga, and In. N-type dopants include P, As, and Sb.

Figure 2:
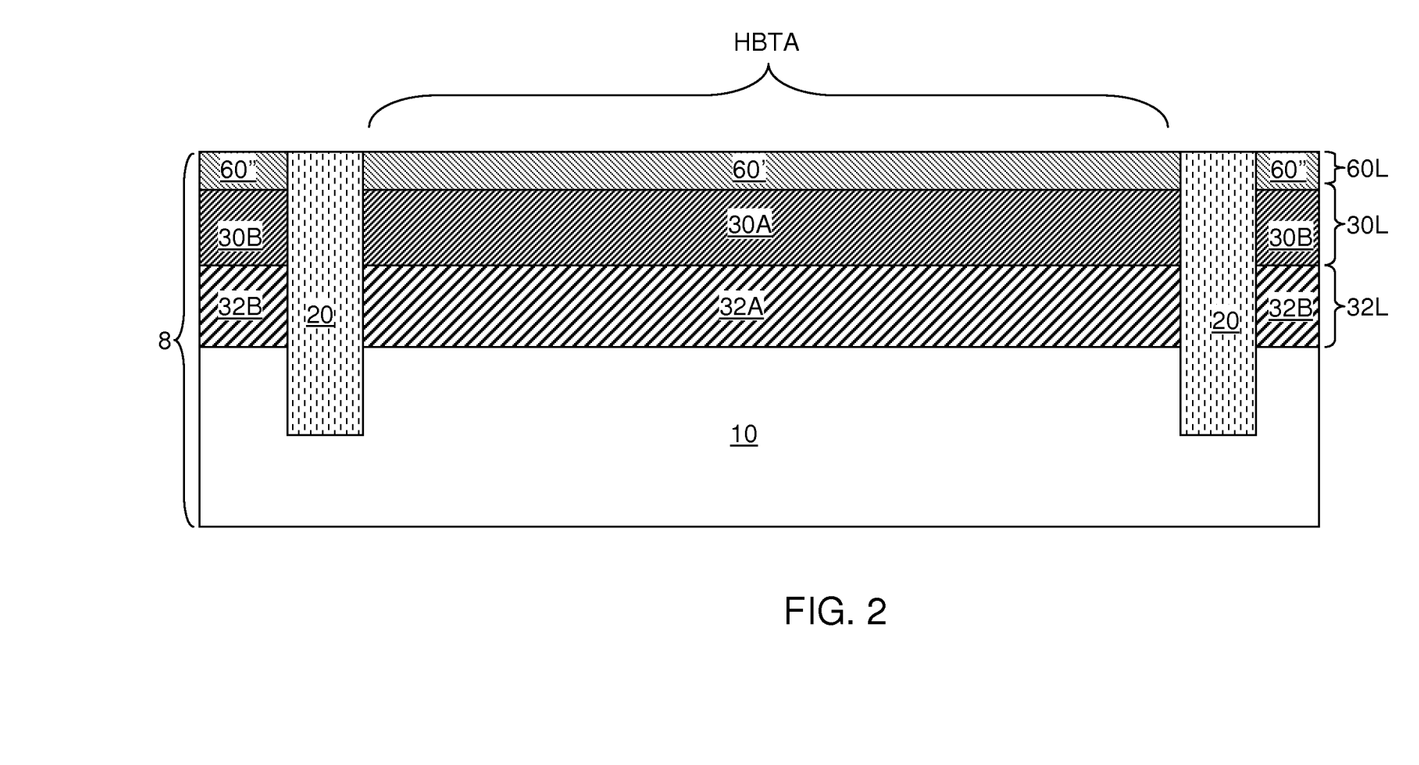
FIG. 2 is a vertical cross-sectional view of the first exemplary structure according to the first embodiment of the present disclosure after formation of deep trench isolation structures.

Referring to FIG. 2, deep trench isolation structures 20 are formed in the substrate 8. The deep trench isolation structures 20 have dielectric outer surfaces. The deep trench isolation structures 20 can be formed by forming deep trenches extending from the top surface of the substrate 8 to a depth greater than the depth of the bottom surface of the subcollector layer 32L, and subsequently filling the deep trenches with a dielectric material or a combination of a dielectric liner and another fill material. For example, the dielectric material or the dielectric liner can be silicon oxide, silicon oxynitride, and/or silicon nitride. If another fill material is employed in combination with a dielectric liner, the fill material is deposited after the dielectric liner is deposited. Exemplary fill materials include, but are not limited to, polysilicon, polycrystalline silicon-germanium alloys, and any dielectric material.

The deep trench isolation structures 20 laterally enclose portions of the base layer 60L, the collector layer 30L, the subcollector layer 32L, and an uppermost portions of the substrate layer 10 within an area, which is herein referred to as a heterojunction bipolar transistor region HBTA. The portion of the subcollector layer 32L laterally surrounded by a deep trench isolation structure 20 and located within the heterojunction bipolar transistor region HBTA is a subcollector 32A. The portion of the collector layer 30L laterally surrounded by a deep trench isolation structure 20 and located within the heterojunction bipolar transistor region HBTA is a collector 30A. The portion of the base layer 60L laterally surrounded by a deep trench isolation structure 20 and located within the heterojunction bipolar transistor region HBTA is a base structure region 60'.

The portion of the subcollector layer 32L located outside the heterojunction bipolar transistor area HBTA is herein referred to as a miscellaneous subcollector-level structure 32B, which may, or may not, be a part of another semiconductor structure (such as another heterojunction bipolar transistor (HBT) to be formed). The portion of the collector layer 30L located outside the heterojunction bipolar transistor area HBTA is herein referred to as a miscellaneous collector-level structure 30B, which may, or may not, be a part of another semiconductor structure. The portion of the base layer 60L located outside the heterojunction bipolar transistor area HBTA is herein referred to as a miscellaneous base-level structure 60", which may, or may not, be a part of another semiconductor structure.

The collector 30A is a first single crystalline germanium portion having a doping of the first conductivity type. The base structure region 60' includes a second single crystalline germanium portion epitaxially aligned to the collector 30A, and has a doping of the second conductivity type. The subcollector 32A includes a third single crystalline germanium portion epitaxially aligned to the collector 30A, and has a doping of the first conductivity type. Typically, the dopant concentration of the subcollector 32A is greater than the dopant concentration of the collector 30A.

Figure 3:
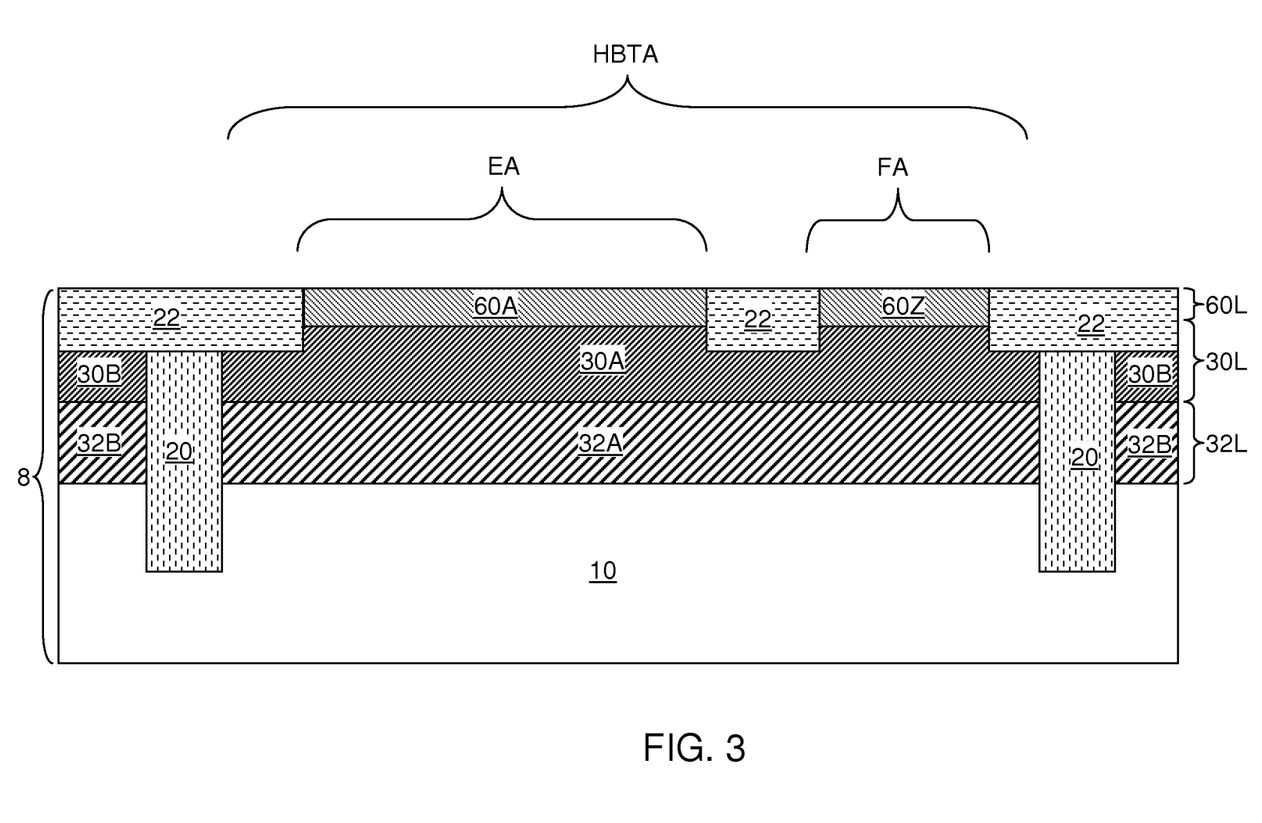
FIG. 3 is a vertical cross-sectional view of the first exemplary structure according to the first embodiment of the present disclosure after formation of shallow trench isolation structures.

Referring to FIG. 3, shallow trench isolation structures 22 are formed in an upper portion of the substrate. The shallow trench isolation structures 22 are formed in areas that include areas within and around the stack of the collector 30A and the base structure region 60'. Specifically, the shallow trench isolation structures 22 can be formed, for example, by etching shallow trenches in the base layer 60L and in the upper portion of the collector layer 30L in areas that overlie the deep trench isolation structures 20 and across a portion of the heterojunction bipolar transistor area HBTA. The shallow trenches are filled with a dielectric material such as silicon oxide, silicon nitride, and/or silicon nitride, and the excess dielectric material above the top surface of the substrate 8 is removed, for example, by planarization such as chemical mechanical planarization (CMP).

The base structure region 60' is divided into a base 60A and a base-level feedthrough region 60Z by a portion of the shallow trench isolation structures 22. The base 60A is formed within an emitter area EA, and the base-level feedthrough region 60Z is formed within a feedthrough area FA. The emitter area EA and the feedthrough area FA do not overlap, and are located within the heterojunction bipolar transistor area HBTA. Each of the base 60A and the base-level feedthrough region 60Z is laterally surrounded by the shallow trench isolation structures 22. The subcollector 32A, the collector 30A, and the base 60A include single crystalline germanium portions that are epitaxially aligned among one another, and are formed within the substrate 8. The base 60A has the same thickness throughout.

Figure 4:
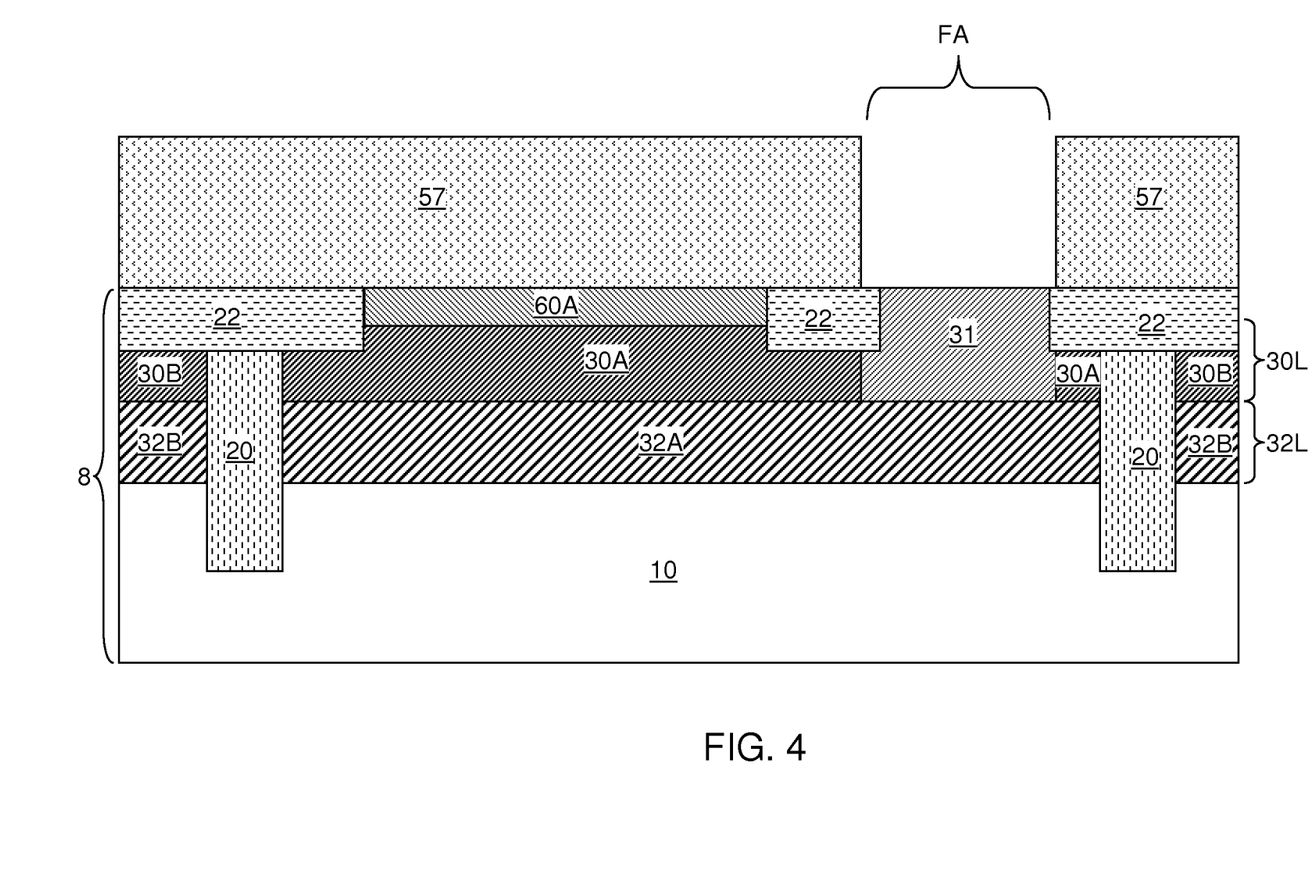
FIG. 4 is a vertical cross-sectional view of the first exemplary structure according to the first embodiment of the present disclosure after formation of a subcollector feedthrough region.

Referring to FIG. 4, a first block level photoresist 57 is applied to the top surface of the substrate 8 and is lithographically patterned to form an opening in the feedthrough area FA. Dopants of the first conductivity type are implanted into the base-level feedthrough region 60Z and a portion of the collector 30A to form a subcollector feedthrough region 31. The subcollector feedthrough region 31 has a doping of the first conductivity type, and extends from the top surface of the substrate 8 to the top surface of the subcollector 32A to provide an electrically conductive path. Thus, the top surface of the subcollector feedthrough region 31 is coplanar with the top surface of the base 60A. The concentration of dopants of the first conductivity type within the subcollector feedthrough region 31 can be from $1.0 \times 10^{18}/cm^3$ to $1.0 \times 10^{21}/cm^3$, and typically from $1.0 \times 10^{19}/cm^3$ to $5.0 \times 10^{20}/cm^3$, although lesser and greater dopant concentrations can also be employed. The only requirement is that the concentration of dopants of the first conductivity type within the subcollector feedthrough 31 is greater than the concentration of dopants of the second type in the base-level feedthrough region 60Z, resulting in the region 60Z being converted from second conductivity type to first conductivity type. The first block level photoresist 57 is subsequently removed, for example, by ashing.

Figure 5:
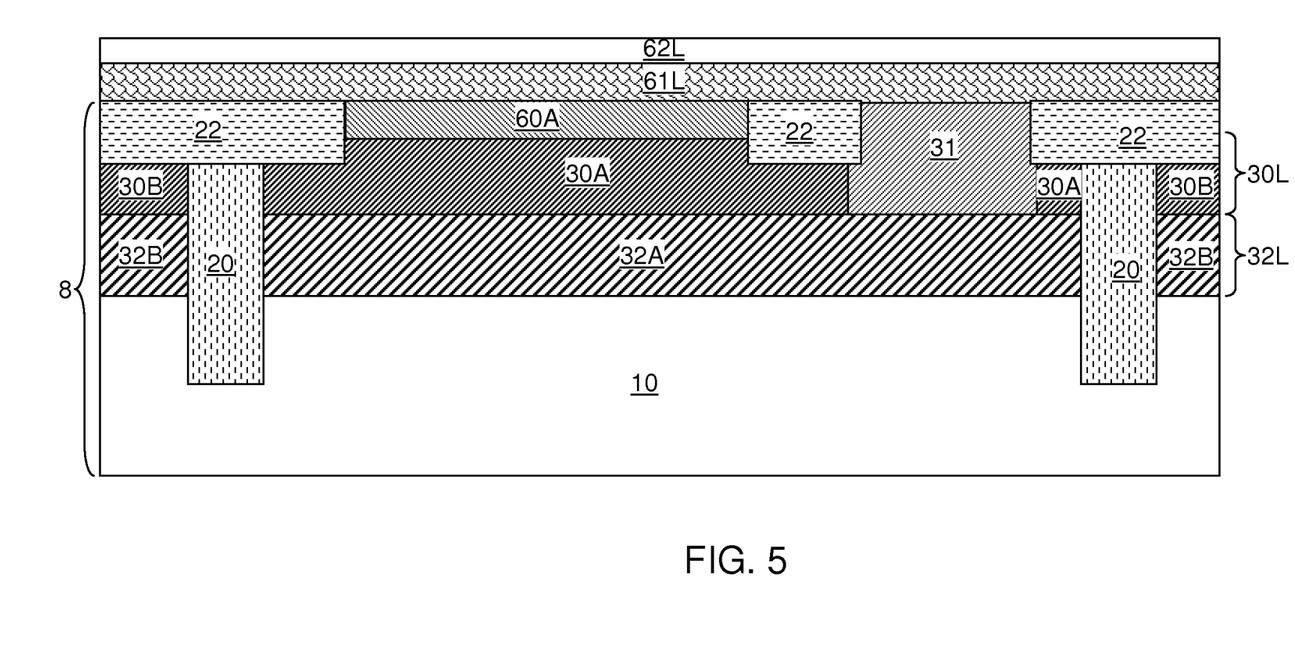
FIG. 5 is a vertical cross-sectional view of the first exemplary structure according to the first embodiment of the present disclosure after formation of an extrinsic base layer and an extrinsic base cap layer.

Referring to FIG. 5, an extrinsic base layer 61L and an extrinsic base cap layer 62L are deposited over the substrate 8. The extrinsic base layer 61L is deposited as a blanket layer having a uniform thickness directly on the top surface of the substrate 8, for example, by chemical vapor deposition. The extrinsic base layer 61L includes a polycrystalline semiconductor material having a doping of the second conductivity type. For example, the extrinsic base layer 61 can include polysilicon, germanium, or a silicon-germanium alloy and dopants of the second conductivity type. The thickness of the extrinsic base layer 61L can be from 20 nm to 300 nm, and typically from 50 nm to 150 nm, although lesser and greater thicknesses can also be employed.

The extrinsic base cap layer 62L is deposited as a blanket layer having a uniform thickness directly on the top surface of the extrinsic base layer 61L, for example, by chemical vapor deposition. The extrinsic base cap layer 61L includes a dielectric material such as silicon oxide, silicon nitride, and/or silicon oxynitride. The thickness of the extrinsic base cap layer 62L can be from 15 nm to 150 nm, and typically from 30 nm to 100 nm, although lesser and greater thicknesses can also be employed.

Figure 6:
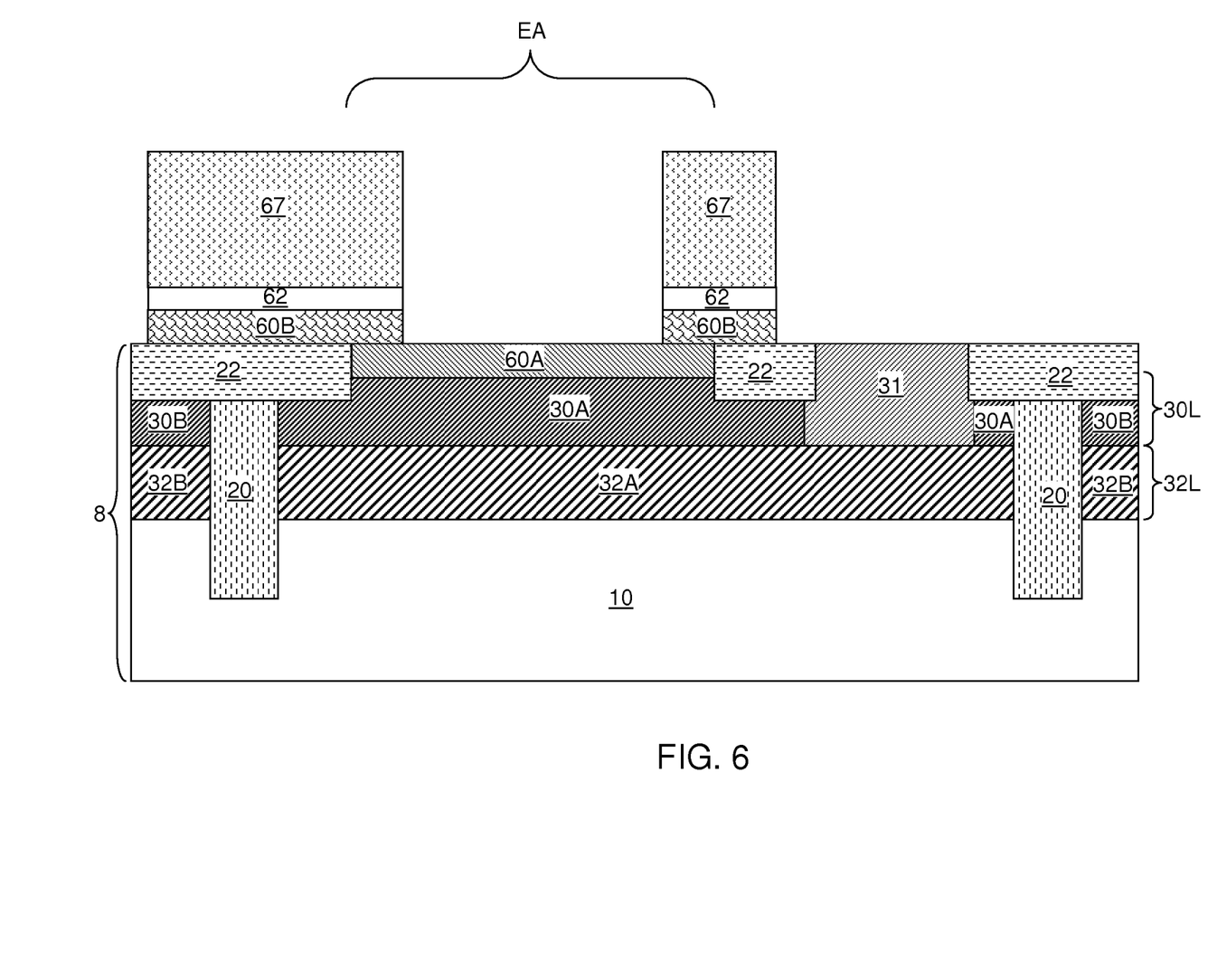
FIG. 6 is a vertical cross-sectional view of the first exemplary structure according to the first embodiment of the present disclosure after lithographic patterning of an extrinsic base and an extrinsic base cap.

Referring to FIG. 6, a second block level photoresist 67 is applied over the stack of the extrinsic base layer 61L and the extrinsic base cap layer 62L. The second block level photoresist 67 is lithographically patterned to form an opening in a center portion of the emitter area EA. The second block level photoresist 67 covers a peripheral portion of the emitter area EA, which is laterally surrounded by the shallow trench isolation structure 22.

An anisotropic etch can be employed to remove the portions of the extrinsic base cap layer 62L and the portions of the extrinsic base layer 61L that are not covered by the patterned second block level photoresist 67. A remaining portion of the extrinsic base cap layer 62L at a periphery of the emitter area EA forms an extrinsic base cap 62, and a remaining portion of the extrinsic base layer 61L around the periphery of the emitter area EA forms an extrinsic base 60B. The sidewalls of the extrinsic base 60B and the sidewalls of the extrinsic base cap 62 are vertically coincident, i.e., coincident when viewed in a vertical direction. The second block level photoresist 67 is subsequently removed, for example, by ashing.

The extrinsic base 60B includes a polycrystalline semiconductor material having a doping of the second conductivity type. The extrinsic base 60B contacts a peripheral portion of the top surface of the base 60A to provide an electrical contact to the base 60A.

Figure 7:
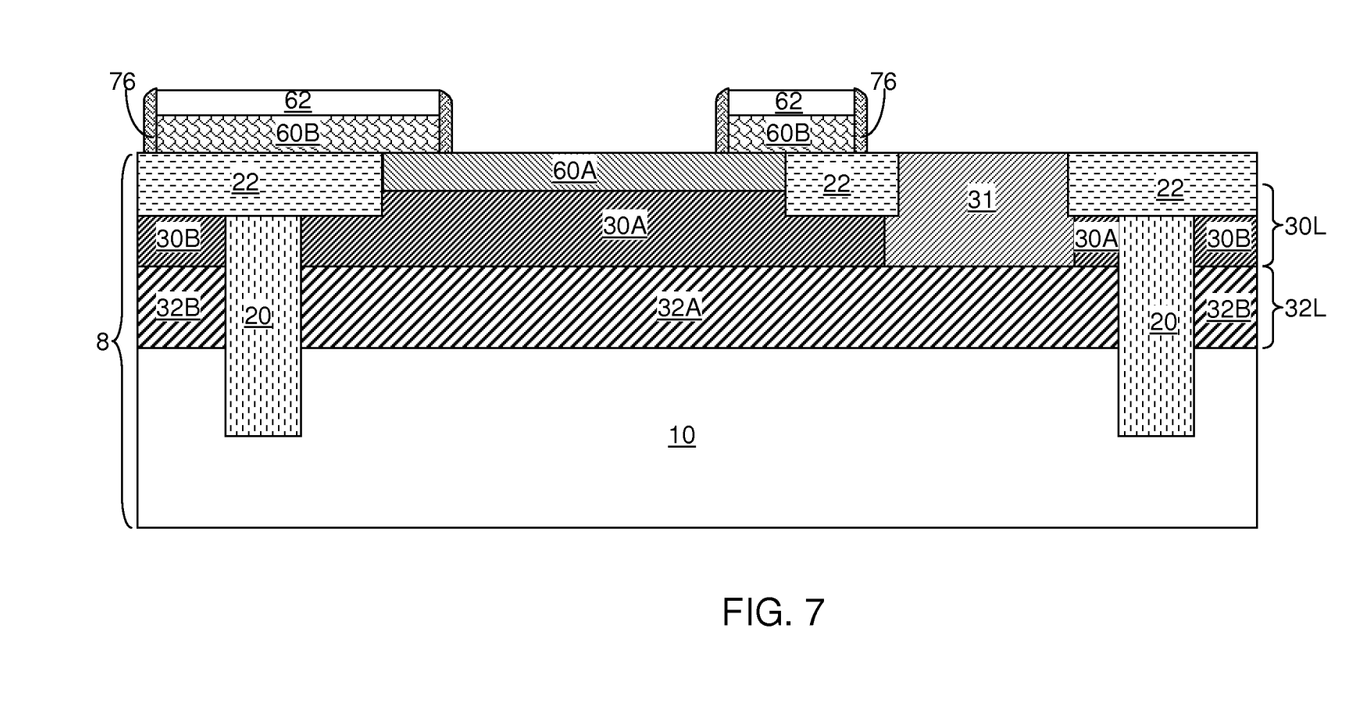
FIG. 7 is a vertical cross-sectional view of the first exemplary structure according to the first embodiment of the present disclosure after formation of dielectric spacers.

Referring to FIG. 7, dielectric spacers 76 are formed on the inner sidewall and the outer sidewall of the stack of the extrinsic base 60B and the extrinsic base cap 62. The dielectric spacers 76 can be formed by deposition of a conformal dielectric material layer and an anisotropic etch that removes horizontal portions of the conformal dielectric material layer. The remaining vertical portions of the conformal dielectric material layer after the anisotropic etch form the dielectric spacers 76. The dielectric spacers 76 include a dielectric material such as silicon oxide, silicon nitride, silicon oxynitride, or a combination thereof. The thickness of the dielectric spacers 76, as measured laterally at a bottom portion that contacts the base 60A or the shallow trench isolation structure 22, can be from 10 nm to 100 nm, although lesser and greater thicknesses can also be employed.

Figure 8:
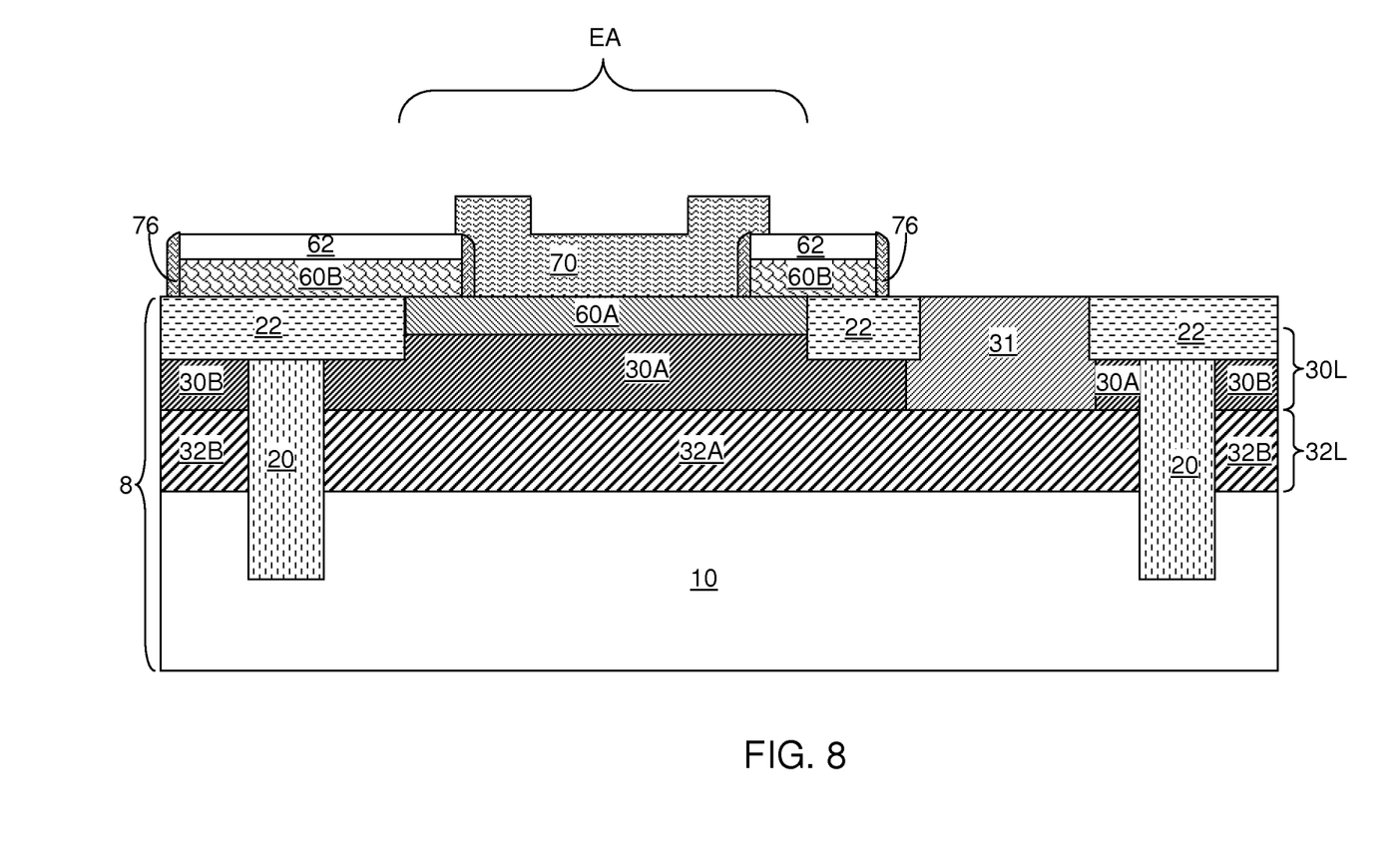
FIG. 8 is a vertical cross-sectional view of the first exemplary structure according to the first embodiment of the present disclosure after formation of a doped polysilicon emitter.

Referring to FIG. 8, a doped polysilicon emitter 70 is formed directly on the exposed top surface of the base 60A and a dielectric spacer 76 located on the inner sidewalls of the stack of the extrinsic base 60B and the extrinsic base cap 62. The doped polysilicon emitter 70 has a doping of the first conductivity type, which is the opposite type of the doping of the base 60A and the extrinsic base 60B. The doped polysilicon emitter 70 can consist essentially of polycrystalline silicon and dopants of the first conductivity type.

To form the doped polysilicon emitter 70, a doped polysilicon layer can be deposited as a blanket layer, for example, by chemical vapor deposition. A photoresist (not shown) is applied and lithographically patterned to cover an area of the doped polysilicon layer that includes the area of the interface between the base 60A and the doped polysilicon layer. An etch is employed to remove the portions of the doped polysilicon layer that is not covered by the photoresist. The photoresist is subsequently removed.

The concentration of dopants of the first conductivity type in the emitter can be from $1.0 \times 10^{19}/cm^3$ to $2.0 \times 10^{21}/cm^3$, and typically from $1.0 \times 10^{20}/cm^3$ to $1.0 \times 10^{21}/cm^3$, although lesser and greater dopant concentrations can also be employed. The thickness of the emitter, as measured from the interface between the base 60A and the emitter 70 to a planar top surface of the emitter that is most proximal to the interface, can be from 50 nm to 500 nm, and typically from 100 nm to 300 nm, although lesser and greater thicknesses can also be employed.

Figure 9:
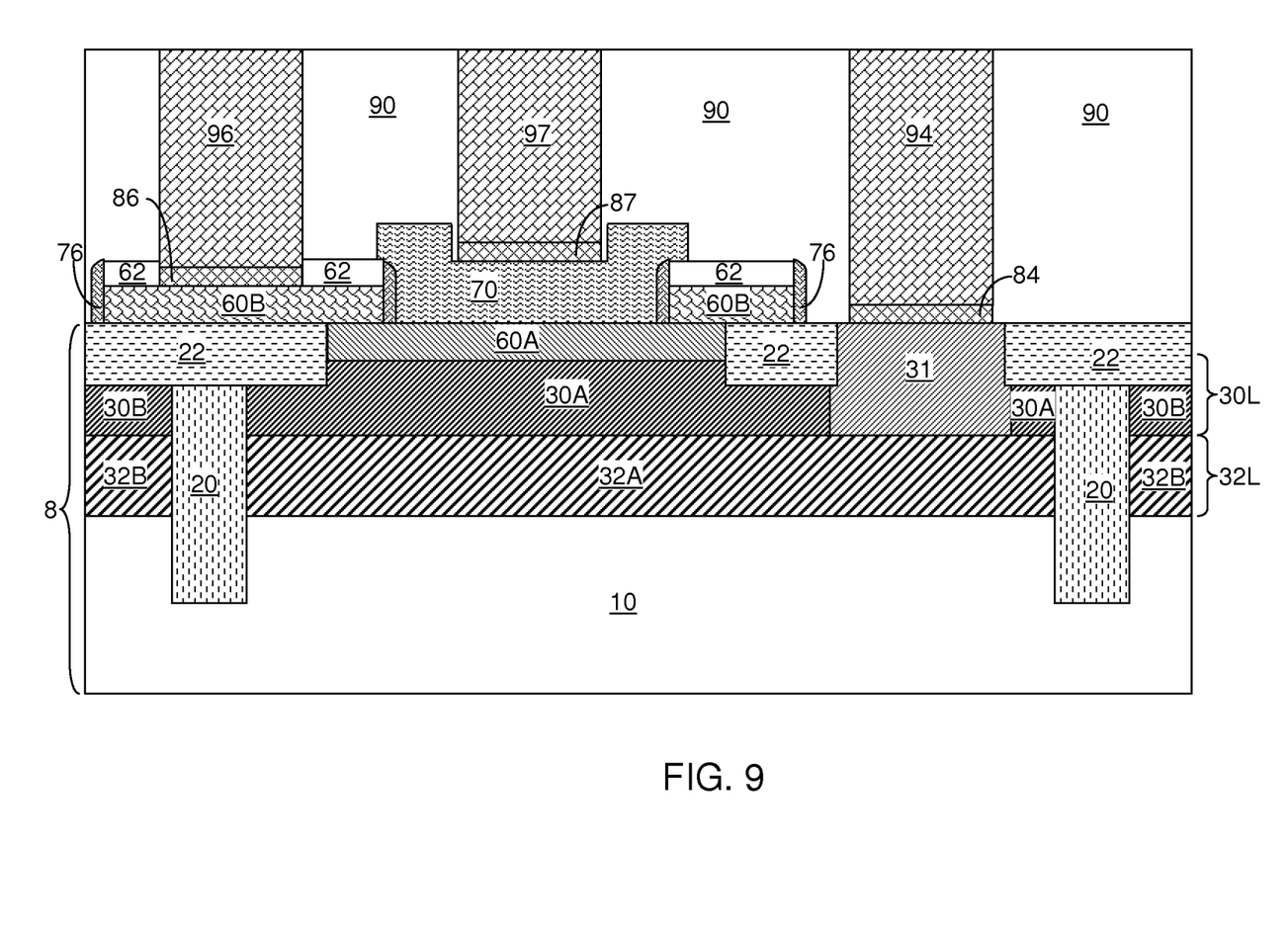
FIG. 9 is a vertical cross-sectional view of the first exemplary structure according to the first embodiment of the present disclosure after formation of a contact-level dielectric material layer and various contact via structures.

Referring to FIG. 9, a contact-level dielectric material layer 90 is deposited over the substrate 8, the stack of the extrinsic base 60B and the extrinsic base cap 62, and the emitter 70. The contact-level dielectric material layer 90 includes a dielectric material such as silicon oxide, silicon nitride, organosilicate glass, or any other dielectric material that can be employed for forming metal interconnect structures as known in the art. For example, the contact-level dielectric material layer 90 can be deposited by chemical vapor deposition or spin coating.

Various contact via structures are formed in the contact-level dielectric material layer 90L to provide electrical contacts to the collector 30A, the base 60A, and the emitter 70. Optionally, metal-semiconductor alloy portions such as a collector-side metal-semiconductor alloy portion 84, a base-side metal-semiconductor alloy portion 86, and an emitter-side metal-semiconductor alloy portion 87 can be formed after formation of via holes in the contact-level dielectric material layer 90 and through the extrinsic base cap 62. The metal-semiconductor alloy portions (84, 86, 87) can be formed, for example, by deposition of a metal layer, formation of metal silicides and metal germanides during an anneal at an elevated temperature, and removal of unreacted portions of the metal layer. The collector-side metal-semiconductor alloy portion 84 is a metal germanide, the emitter-side metal-semiconductor alloy portion 87 is a metal silicide, and the base-side metal-semiconductor alloy portion 86 can be a metal silicide, a metal germanide, or a metal germanosilicide depending on the composition of the doped semiconductor material in the extrinsic base 60B.

The various contact via structures can be formed by filling the via holes in the contact-level dielectric material layer 90 with a conductive material followed by removal of excess conductive material above the contact-level dielectric material layer 90. The various contact via structures include an emitter contact via structure 97 conductively connected to the emitter 70 and embedded in the contact-level dielectric material layer 90, a base contact via structure 96 conductively connected to the base 60A and embedded in the contact-level dielectric material layer 90; and a collector contact via structure 94 conductively connected to the collector 30A and embedded in the contact-level dielectric material layer 90. As used herein, a first element is conductively connected to a second element if there exists a conductive current path between the first element and the second element. Specifically, the emitter contact via structure 97 directly contacts the emitter 70 or is conductively connected to the emitted 70 via the emitter-side metal-semiconductor alloy portion 87. The base contact via structure 96 is conductively connected to the base 60A through the extrinsic base 60B and optionally through the base-side metal-semiconductor alloy portion 86. The collector contact via structure 94 is conductively connected to the collector 30A via the subcollector 32A and the subcollector feedthrough region 31 and optionally through the collector-side metal-semiconductor alloy portion 84.

The first exemplary structure includes a heterojunction bipolar transistor (HBT) structure in which the emitter 70 and the base 60A have different semiconductor materials. In the operation of bipolar transistor, for a given emitter-base forward bias, the collector current is proportional to $\exp(-Eg_{base}/kT)$, where $Eg_{base}$ is the energy bandgap of the base region. Thus, a small base bandgap leads to large collector current. The base current is proportional to $\exp(-Eg_{emitter}/kT)$, where $Eg_{emitter}$ is the energy bandgap of the emitter region. Thus a large emitter energy bandgap leads to small base current. Germanium, with a bandgap of 0.66 eV, is excellent as the narrow-gap base material. Polysilicon, with a bandgap of about 1.12 eV and compatible with modern very large scale integration (VLSI) technology, is an excellent wide-gap emitter material.

The heterojunction bipolar transistor (HBT) of the present disclosure employs a wide-gap emitter and a narrow-gap base. Specifically, the HBT of the present disclosure employs a single crystalline germanium base to provide a narrow-gap base and a polysilicon emitter to provide a wide-gap emitter. The HBT of the present disclosure is superior for low-voltage operation in comparison with prior art bipolar transistors because of the differences in the bandgap between the material of the base and the material of the emitter.

As an example, consider trying to obtain a collector current density of 10 mA/$\mu m^2$. A usual bipolar transistor having a single crystalline silicon base and a polysilicon emitter needs a emitter-base forward bias of 0.92 V. If the silicon base is replaced with a single crystalline SiGe alloy with 20% of Ge in atomic concentration to provide a usual SiGe-base transistor having an energy bandgap of 200 meV smaller than the energy bandgap of silicon, the required emitter-base bias is about 0.72 V. For the HBT of the present disclosure having a single crystalline germanium base and a polysilicon emitter, the corresponding voltage required for providing collector current density of 10 mA/$\mu m^2$ is only 0.46 V.

Figure 10:
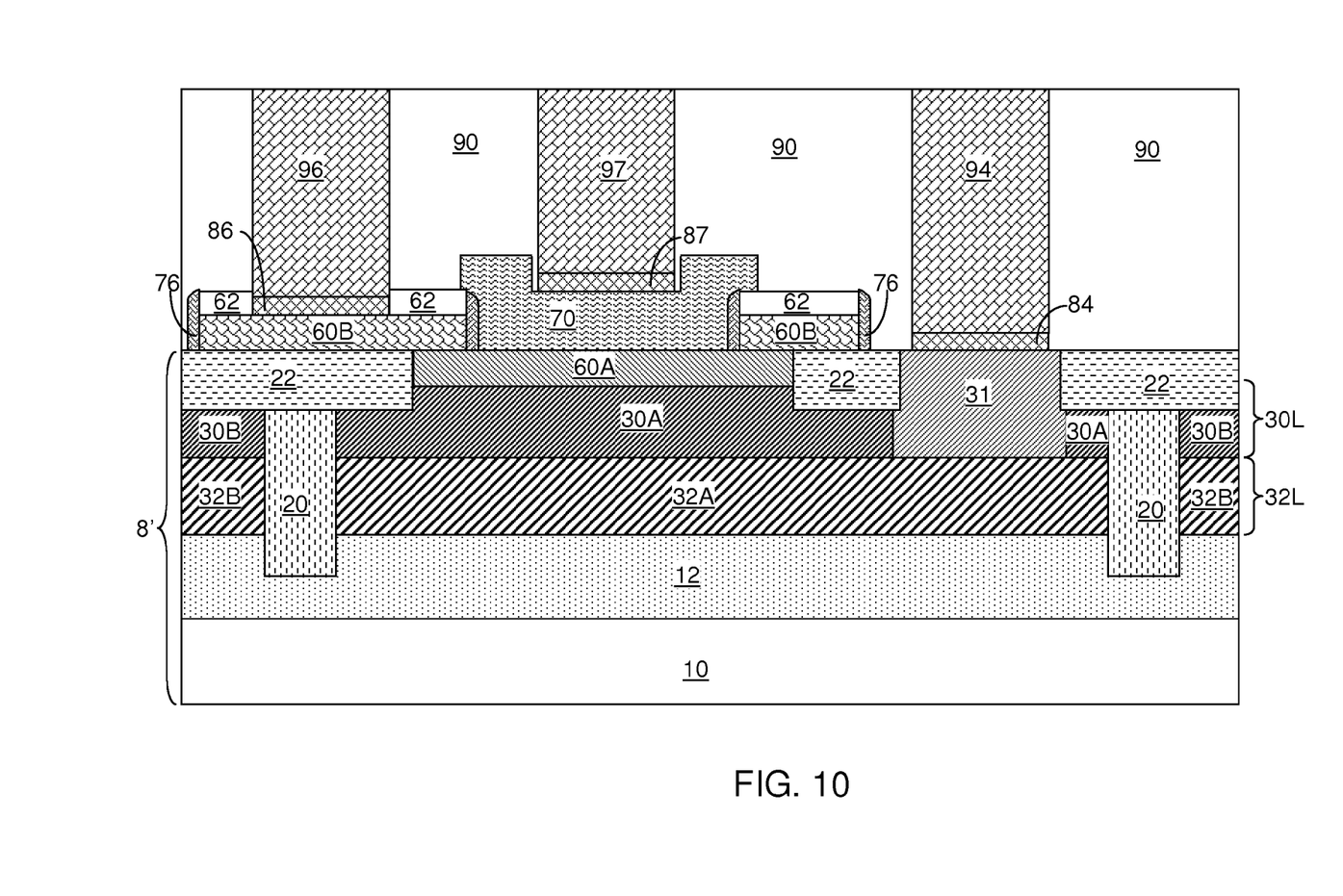
FIG. 10 is a vertical cross-sectional view of a second exemplary structure according to a second embodiment of the present disclosure.

Referring to FIG. 10, a second exemplary structure according to a second embodiment of the present disclosure can be formed by employing a germanium-on-insulator (GOI) substrate 8' instead of the substrate 8 of the first exemplary semiconductor structure. The GOI substrate 8' includes a stack of a substrate layer 10, a buried insulator layer 12 that includes a dielectric material such as silicon oxide, silicon nitride, and/or silicon oxynitride, and a singe crystalline germanium layer. A subcollector layer 32L, a collector layer 30L, and a base layer 60L are formed employing the same methods as the methods employed at the step corresponding to FIG. 1 of the first embodiment. Subsequently, processing steps of FIGS. 2-9 can be employed to provide the second exemplary structure. In the second exemplary structure, a bottom surface of the subcollector 32A contacts the top surface of a buried insulator layer 12 within the GOI substrate 8'. The HBT structure in the second exemplary structure can provide the same functional advantage as the HBT structure in the first exemplary structure in addition to providing enhanced electrical isolation from adjacent devices and the substrate layer 10 due to the presence of the buried insulator layer 12.

Figure 11:
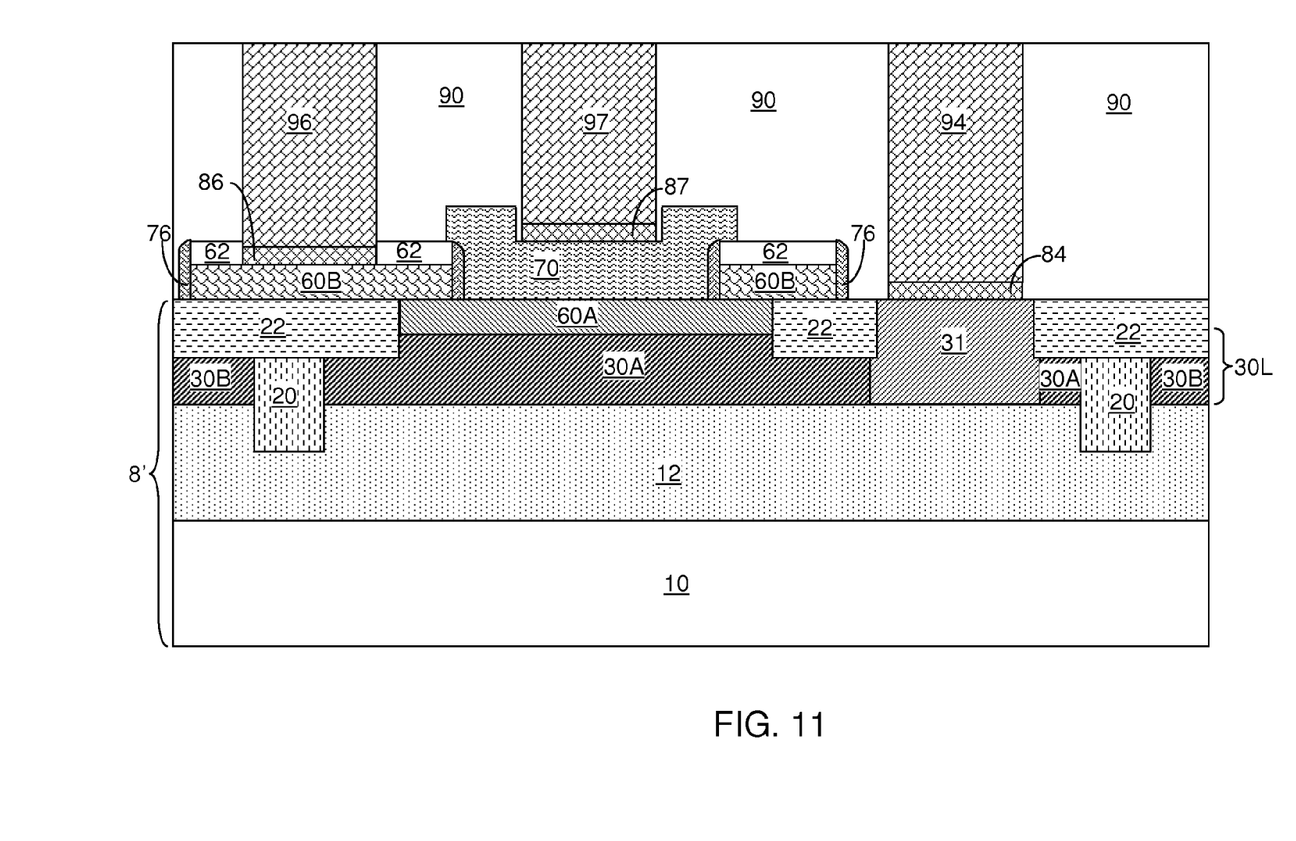
FIG. 11 is a vertical cross-sectional view of a third exemplary structure according to a third embodiment of the present disclosure.

Referring to FIG. 11, a third exemplary structure according to a third embodiment of the present disclosure is derived from the second exemplary structure by omitting the formation of a subcollector layer 32L at the processing step corresponding to the processing step of FIG. 1. Thus, the bottom surface of the collector 30A contacts the top surface of a buried insulator layer 12 within the GOI substrate 8'. The HBT structure in the third exemplary structure can provide the same functional advantage as the HBT structure in the first exemplary structure in addition to providing enhanced electrical isolation from adjacent devices and the substrate layer 10 due to the presence of the buried insulator layer 12. The HBT structure in the third exemplary structure simplifies the manufacturing process by eliminating the subcollector 32A, but the resistance between the collector contact via structure 94 and the collector 30A can be greater in the third exemplary structure than in the second exemplary structure.

While this disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a heterojunction bipolar transistor (HBT) structure, comprising:
    forming a collector and a base in a substrate, wherein said substrate comprises a buried insulator layer, wherein said collector comprises a first single crystalline germanium portion having a doping of a first conductivity type, and said base comprises a second single crystalline germanium portion epitaxially aligned to said collector and has a doping of a second conductivity type that is the opposite of said first conductivity type;
    forming deep trench isolation structures, wherein said deep trench isolation structures extend from a top surface of said substrate, through said collector to a depth beneath a top surface of said buried insulator layer; and
    forming an emitter comprising a polycrystalline silicon portion having a doping of said first conductivity type directly on said base.

2. The method of claim 1, wherein said second single crystalline germanium portion consists essentially of germanium and dopants of said second conductivity type.

3. The method of claim 1, wherein said polycrystalline silicon portion consists essentially of polycrystalline silicon and dopants of said first conductivity type.

4. The method of claim 1, further comprising forming a stack of a collector layer and a base layer, wherein said collector layer is a first single crystalline germanium layer having a doping of said first conductivity type and said base layer is a second single crystalline germanium layer epitaxially aligned to said collector layer and has a doping of said second conductivity type.

5. The method of claim 1, further comprising forming a shallow trench isolation structure in an upper portion of the substrate, such that the shallow trench isolation structure creates a stack with said deep trench isolation structure.

6. The method of claim 1, wherein said base and said collector are formed in a single crystalline germanium substrate, and a horizontal top surface of said base is a top surface of said single crystalline germanium substrate.

7. The method of claim 1, wherein an entirety of the substrate is a single crystalline substrate with epitaxial alignment throughout the entirety thereof.

8. The method of claim 1, further comprising forming an extrinsic base comprising a polycrystalline semiconductor material having a doping of said second conductivity type directly on a peripheral portion of said base.

9. The method of claim 8, further comprising forming a dielectric spacer directly on a sidewall of said extrinsic base, wherein said emitter is formed on another sidewall of said extrinsic base.

10. The method of claim 1, further comprising forming a subcollector comprising a third single crystalline germanium portion and having a doping of said first conductivity type in a substrate.

11. The method of claim 10, wherein said collector contacts said subcollector, and a dopant concentration of said subcollector is greater than a dopant concentration of said collector.

12. The method of claim 10, further comprising forming a subcollector feedthrough region by implanting dopants of said first conductivity type into a germanium-containing portion, wherein said collector feedthrough contacts said subcollector.

13. The method of claim 12, wherein said subcollector feedthrough region extends from said subcollector to a surface that is coplanar with a top surface of said base.

14. The method of claim 1, wherein said base and said collector are formed in a germanium-on-insulator (GOI) substrate.

15. The method of claim 14, further comprising forming a subcollector comprising a third single crystalline germanium portion and having a doping of said first conductivity type within said GOI substrate, wherein a bottom surface of said subcollector contacts a top surface of said buried insulator layer within said GOI substrate.

16. The method of claim 14, wherein said collector is formed directly on a top surface of said buried insulator layer within said GOI substrate.

17. The method of claim 1, further comprising forming a contact-level dielectric material layer over said emitter, said base, and said collector.

18. The method of claim 17, further comprising:
    forming an emitter contact via structure on said emitter through said contact-level dielectric material layer;
    forming a base contact via structure on an extrinsic base through said contact-level dielectric material layer; and
    forming a collector contact via structure on said collector through said contact-level dielectric material layer.

* * * * *